(12) United States Patent
Senoo

(10) Patent No.: US 9,178,014 B2
(45) Date of Patent: Nov. 3, 2015

(54) SEMICONDUCTOR DEVICE

(75) Inventor: Masaru Senoo, Okazaki (JP)

(73) Assignee: TOYOTA JIDOSHA KABUSHIKI KAISHA, Toyota-Shi (JP)

(*) Notice: Subject to any disclaimer, the term of this patent is extended or adjusted under 35 U.S.C. 154(b) by 0 days.

(21) Appl. No.: 14/383,942

(22) PCT Filed: Mar. 22, 2012

(86) PCT No.: PCT/JP2012/057328
§ 371 (c)(1),
(2), (4) Date: Sep. 9, 2014

(87) PCT Pub. No.: WO2013/140572
PCT Pub. Date: Sep. 26, 2013

(65) Prior Publication Data
US 2015/0054118 A1 Feb. 26, 2015

(51) Int. Cl.
*H01L 29/06* (2006.01)
*H01L 29/40* (2006.01)
*H01L 29/739* (2006.01)
*H01L 29/78* (2006.01)

(52) U.S. Cl.
CPC ........ *H01L 29/0619* (2013.01); *H01L 29/0696* (2013.01); *H01L 29/402* (2013.01); *H01L 29/404* (2013.01); *H01L 29/7395* (2013.01); *H01L 29/7811* (2013.01); *H01L 29/0638* (2013.01)

(58) Field of Classification Search
CPC ............ H01L 29/0696; H01L 29/0619; H01L 29/7395; H01L 29/0638; H01L 29/402; H01L 29/404; H01L 23/585; H01L 2924/13055; H01L 29/02
See application file for complete search history.

(56) References Cited

U.S. PATENT DOCUMENTS

2009/0045481 A1   2/2009  Niimura et al.

FOREIGN PATENT DOCUMENTS

| JP | 2003-086815 A | 3/2003 |
| JP | 2009-038356 A | 2/2009 |
| JP | 2011-082315 A | 4/2011 |

*Primary Examiner* — Roy Potter
*Assistant Examiner* — Paul Patton
(74) *Attorney, Agent, or Firm* — Kenyon & Kenyon LLP

(57) ABSTRACT

A semiconductor device includes a semiconductor substrate, and a field plate portion formed on a front surface of a non-cell region. The non-cell region includes a plurality of FLR layers. The FLR layers extend in a first direction along a circumference of the cell region. The field plate portion includes: an insulating film; a plurality of first conducting layers each disposed along a corresponding FLR layer; and a plurality of second conducting layers. The second conducting layers are disposed on part of their corresponding FLR layers in an intermittent manner along the corresponding FLR layers. Each of the second conducting layers includes a front surface portion, a first contact portion, and a second contact portion. Any of the first contact portions and the second contact portions are not provided at positions adjacent to the first contact portion and the second contact portion in the second direction.

3 Claims, 14 Drawing Sheets

FIG. 7
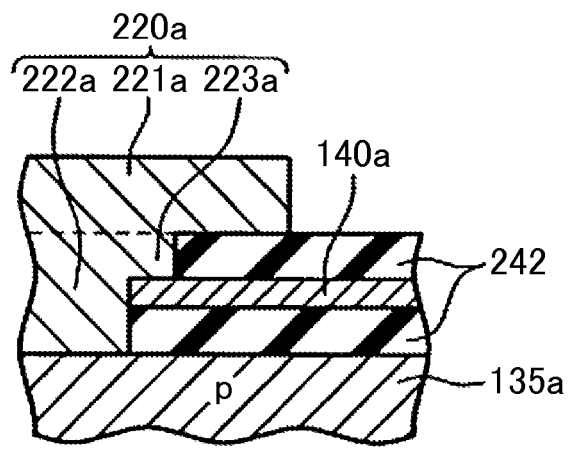
FIG. 8
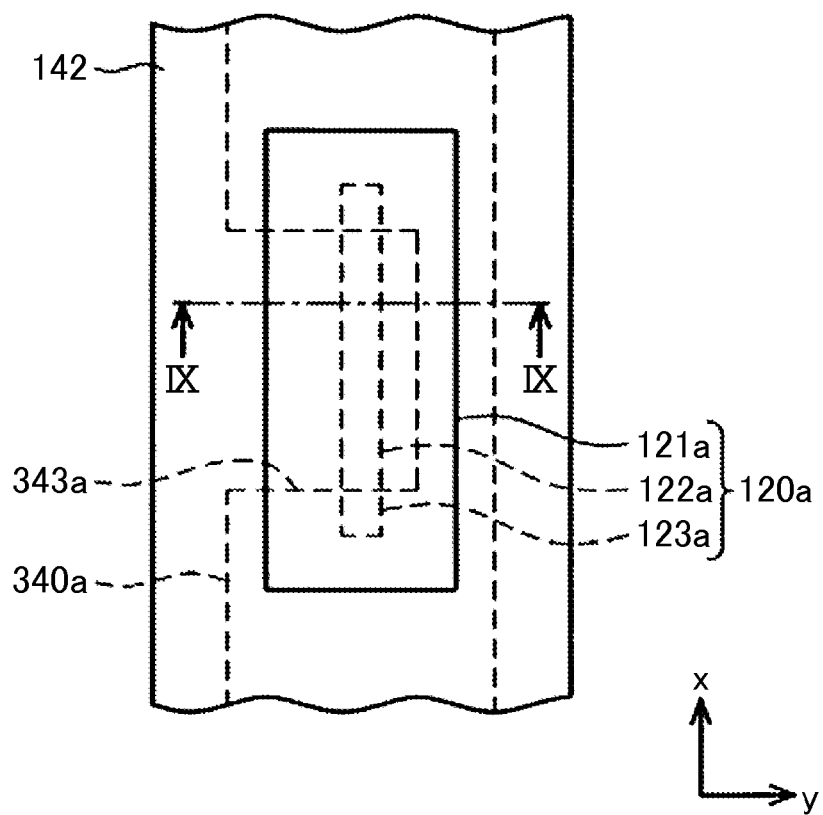

F I G . 13
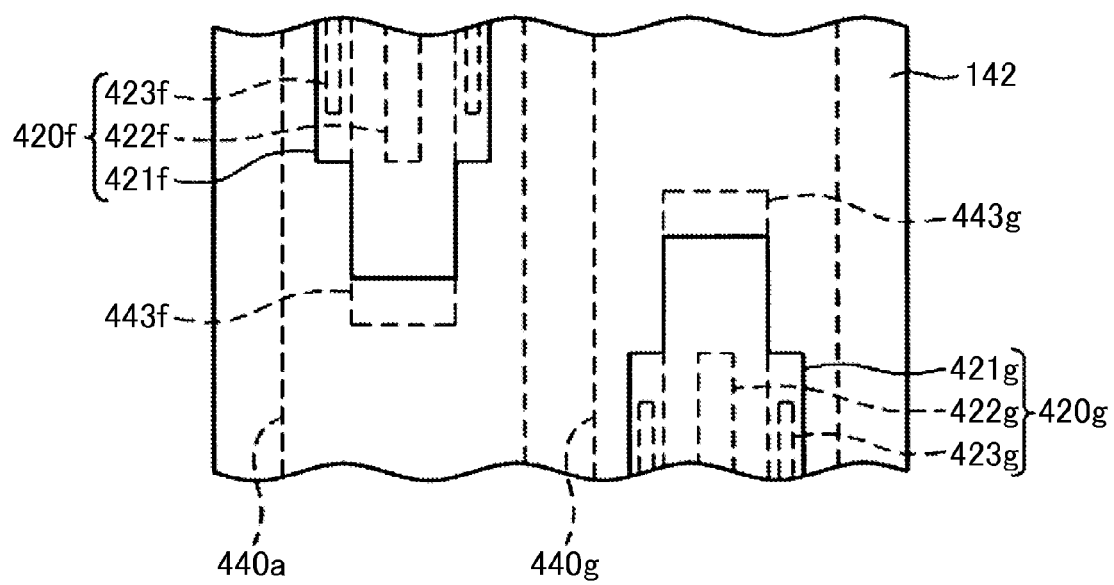

SEMICONDUCTOR DEVICE

CROSS-REFERENCE TO RELATED APPLICATIONS

This is a national phase application based on the PCT International Patent Application No. PCT/JP2012/057328 filed Mar. 22, 2012, the entire contents of which are incorporated herein by reference.

TECHNICAL FIELD

A technique described in the present specification relates to a semiconductor device.

BACKGROUND ART

In order to secure a breakdown voltage of a semiconductor device, a breakdown voltage holding structure such as a field limiting ring (FLR) layer is formed in a non-cell region on a circumference side of the semiconductor substrate. Further, in order to secure reliability of the semiconductor device, a field plate is formed on a front side of the FLR layer. In a semiconductor device described in Japan Patent Application Publication No. 2009-38356 (JP 2009-38356 A) (Patent Document 1), a field plate including a plurality of metal layers and a plurality of polysilicon layers is formed on a front side a plurality of FLR layers. The plurality of FLR layers is provided so as to surround a cell region, and to be disposed at intervals in a direction perpendicular to a longitudinal direction thereof. The metal layers and the polysilicon layers are formed so as to correspond to the plurality of FLR layers, and are disposed along their corresponding FLR layers. The polysilicon layer is formed in an insulating film formed on a front surface of a semiconductor substrate. The metal layer is formed on a front surface of the insulating film, and partially penetrates through the insulating film so as to reach the FLR layer. Further, the polysilicon layer and the metal layer make contact with each other, so as to be electrically connected with each other.

CITATION LIST

Patent Document

Patent Document 1: Japanese Patent Application Publication No. 2009-38356 (JP 2009-38356 A)

SUMMARY OF THE INVENTION

Problem to be Solved by the Invention

In order that a semiconductor device has a high breakdown voltage, it is demanded that an interval between FLR layers adjacent to each other is narrowed. However, generally, a field plate is provided so as to correspond to the FLR layers, and therefore, it is necessary that the interval between the FLR layers should be set to an interval that allows the field plate to be placed. For example, in a case where a thick metal layer as described in JP 2009-38356 A is used, it is necessary to sufficiently widen the interval between the FLR layers on an inner circumference side (closer to a cell region) because it is difficult to form a fine metal layer.

Means for Solving the Problem

A semiconductor device described in the present specification includes a semiconductor substrate having a cell region where a semiconductor element is formed, and a non-cell region provided around the cell region; and a field plate portion formed on a front surface of the non-cell region. The non-cell region includes a first-conductivity-type substrate layer, and a plurality of second-conductivity-type FLR layers formed on a front surface of the substrate layer, extending in a first direction along a circumference of the cell region so as to surround the cell region, and disposed at intervals in a second direction perpendicular to the first direction. The field plate portion includes: an insulating film formed on a front surface of the semiconductor substrate; a plurality of first conducting layers each formed in the insulating film for its corresponding FLR layer so as to be disposed along the corresponding FLR layer when the semiconductor substrate is viewed in a plane manner; and a plurality of second conducting layers formed so as to respectively correspond to at least two FLR layers adjacent to each other and to be disposed on part of their corresponding FLR layers in an intermittent manner along the corresponding FLR layers when the semiconductor substrate is viewed in a plane manner, each of the second conducting layers including a front surface portion formed on a front surface of the insulating film, a first contact portion extending from the front surface portion and penetrating through the insulating film so as to be electrically connected to the first conducting layer, and a second contact portion extending from the front surface portion and penetrating through the insulating film so as to be electrically connected to the FLR layer. Any first contact portions of the other second conducting layers are not provided at a position adjacent to a first contact portion of one second conducting layer in the second direction. Any second contact portions of the other second conducting layers are not provided at a position adjacent to a second contact portion of one second conducting layer in the second direction.

In the above semiconductor device, the second conducting layer is disposed along the FLR layer intermittently, and any first contact portions and second contact portions of the other second conducting layers are not provided at respective positions adjacent to a first contact portion of one second conducting layer in the second direction and to a second contact portion thereof in the second direction. Since the first contact portions and the second contact portions do not overlap with each other in the second direction, even if an interval between the FLR layers is narrowed, it is possible to secure widths of the second conducting layers in the second direction. In a case where a thick metal film or the like that is difficult to be made fine is used as the second conducting layers, it is possible to narrow the interval between the FLR layers on an inner circumference side, thereby making it possible to attain a high breakdown voltage of a semiconductor device.

The field plate portion may further includes a third conducting layer disposed along its corresponding FLR layer where no second conducting layer is formed when the semiconductor substrate is viewed in a plane manner, the third conducting layer including a front surface portion formed on the front surface of the insulating film, and a third contact portion extending from the front surface portion and penetrating through the insulating film so as to be electrically connected to the corresponding FLR layer, and the third conducting layer may be provided closer to a circumference side of the semiconductor substrate than the plurality of second conducting layers.

It is preferable that an end part of the second conducting layer in the first direction be provided in an area except for corners of the semiconductor substrate viewed in a plane manner.

BRIEF DESCRIPTION OF THE DRAWINGS

FIG. 7 is a sectional view of an area around a second conducting layer of a semiconductor device according to a modified embodiment.

FIG. 8 is a plan view of an area around a second conducting layer of a semiconductor device according to a modified embodiment.

FIG. 13 is a plan view of an area around a second conducting layer of a semiconductor device according to a modified embodiment.

MODES FOR CARRYING OUT THE INVENTION

Figure 1:
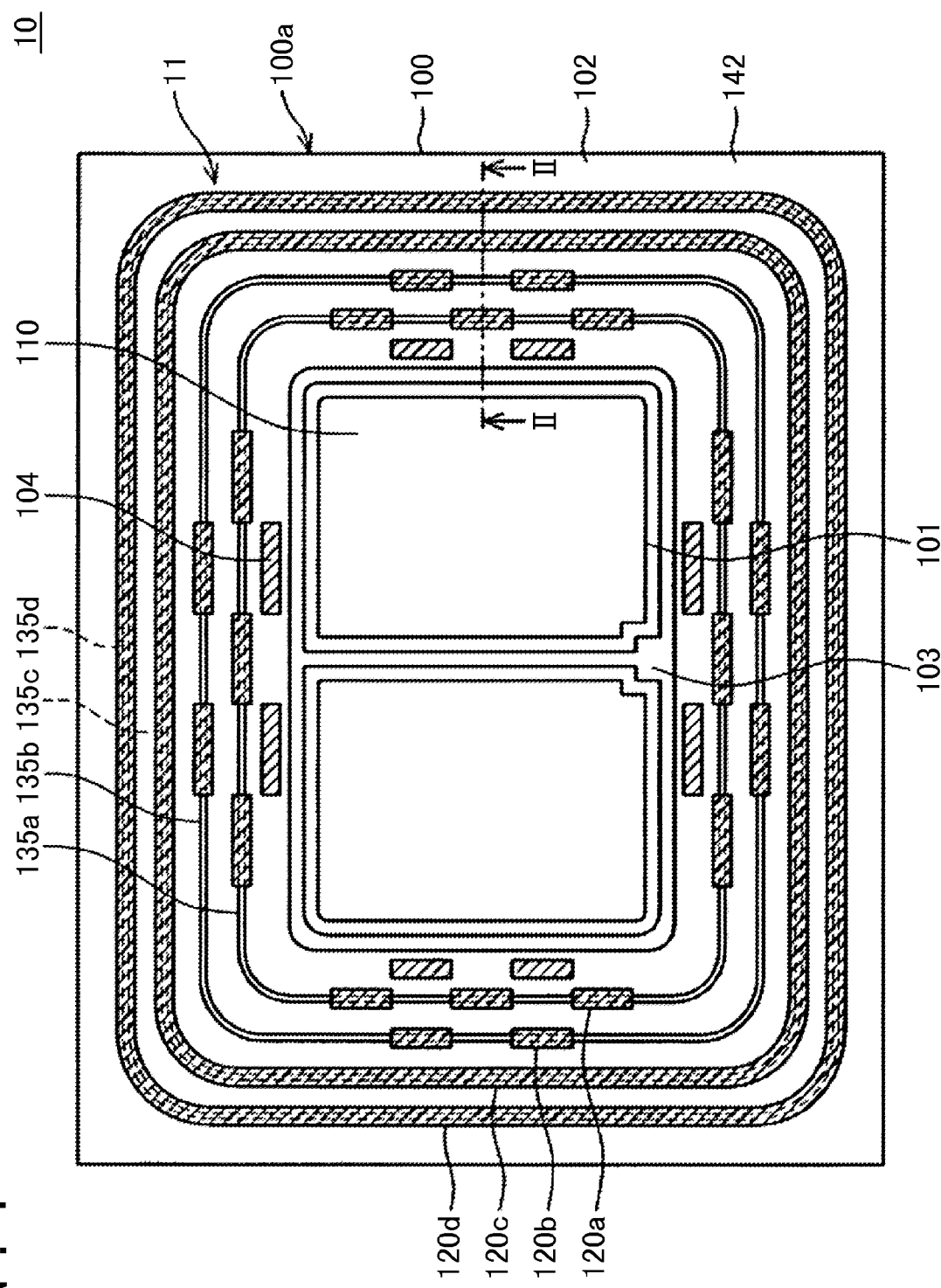
FIG. 1 is a plane view conceptually illustrating a semiconductor device according to Embodiment 1.

A semiconductor device described in the present specification includes: a semiconductor substrate having a cell region where a semiconductor element is formed, and a non-cell region provided around the cell region; and a field plate portion formed on a front surface of the non-cell region. The semiconductor device may further include a front-surface electrode formed on a front surface of the cell region, and a back-surface electrode formed on a back surface of the cell region. A material of the front-surface electrode is not limited, but a metal film mainly made from aluminum (Al) or alloy (AlSi) of aluminum and silicon can be preferably used, for example. A material of the back-surface electrode is not limited, but a laminating electrode in which laminating Al or AlSi, titanium (Ti), nickel (Ni), and a nickel protection film such as gold (Au) are laminated sequentially from a semiconductor substrate side, for example, can be used preferably.

The non-cell region includes a first-conductivity-type substrate layer, and a plurality of second-conductivity-type FLR layers formed on a front surface of the substrate layer. The plurality of FLR layers extends in a first direction along a circumference of the cell region so as to surround the cell region, and is disposed at an interval in a second direction perpendicular to the first direction. In the non-cell region, a region where the FLR layers are formed is a so-called breakdown voltage holding region. A concentration of second-conductivity-type impurity of the FLR layer is preferably $1 \times 10^{12}$ cm$^{-2}$ or more, and particularly preferably $1 \times 10^{14}$ cm$^{-2}$ or more.

The field plate portion includes an insulating film, a plurality of first conducting layers, and a plurality of second conducting layers. It is preferable that the field plate portion be formed on a front surface of the breakdown voltage holding region provided in the non-cell region. The insulating film is formed on a front surface of the semiconductor substrate.

The first conducting layers are each formed in the insulating film for its corresponding FLR layer so as to be disposed along the corresponding FLR layer when the semiconductor substrate is viewed in a plane manner. A material of the first conducting layer is not limited, but it is possible to preferably use a metal film such as aluminum, silver (Ag), or the like, as well as a silicon-based film such as polysilicon, amorphous silicon, silicon nitride, or the like. It is preferable to use the silicon-based film as the first conducting layer, because it is generally possible to achieve miniaturization as compared with a case where a thick metal film is used. Further, in a case where a semiconductor element having an insulated gate, such as an IGBT, is formed in the cell region, it is preferable to use a material (e.g., polysilicon) of a gate electrode is used as a material of the first conducting layer, because it is possible to form the first conducting layer at the same time in a step of forming the gate. It is preferable that a film thickness of the first conducting layer be 1 μm or less. As the film thickness of the first conducting layer is thinner, it is possible to reduce an interval between the first conducting layers adjacent to each other, thereby making it possible to improve a shield characteristic with respect to mobile ions.

The second conducting layers are formed so as to respectively correspond to at least two FLR layers adjacent to each other, and disposed on part of their corresponding FLR layers in an intermittent manner along the corresponding FLR layers when the semiconductor substrate is viewed in a plane manner. Each of the second conducting layers includes: a front surface portion formed on a front surface of the insulating film; a first contact portion extending from the front surface portion and penetrating through the insulating film so as to be electrically connected to the first conducting layer; and a second contact portion extending from the front surface portion and penetrating through the insulating film so as to be electrically connected to the FLR layer. The FLR layer is electrically connected to the first conducting layer via the second conducting layer. A material of the second conducting layer is not limited, but it is possible to preferably use a metal film such as aluminum, silver (Ag), or the like, as well as a silicon-based film such as polysilicon, amorphous silicon, silicon nitride, or the like. It is preferable to use, as the second conducting layer, a film made from the same material (e.g., Al or AlSi) as a material included in the front-surface electrode, because it is possible to form the second conducting layer at the same time in a step of forming the front-surface electrode.

Further, any first contact portions of the other second conducting layers are not provided at a position adjacent to a first contact portion of one second conducting layer in the second direction. Any second contact portions of the other second conducting layers are not provided at a position adjacent to a second contact portion of one second conducting layer in the second direction. Here, in a case where one second conducting layer is provided along one FLR layer on a front side thereof, the "adjacent position" to the "one second conducting layer" indicates a position of a front side of a FLR layer placed at one side of the above one FLR layer in the second direction, or positions of front sides of two FLR layers placed at both sides of the above one FLR layer in the second direction. The second conducting layers formed on the front sides of the FLR layers adjacent to each other in the second direction' are disposed so that their first contact portions and their second contact portions do not overlap with each other in the second direction. Hereby, even if the first contact portion and the second contact portion of one second conducting layer are widened in the second direction, they do not interfere with the first contact portions and the second contact portions of the other second conducting layers. It is possible to broaden widths of the first contact portion and the second contact portion in the second direction, and eventually, it is possible to broaden a width of the second conducting layer in the second direction. Particularly, even in a case where a thick metal film or the like that is relatively difficult to be made fine is used as the second conducting layer, it is possible to narrow an interval between the FLR layers without narrowing the widths of the second conducting layers in the second direction, thereby making it possible to attain a semiconductor device having a high breakdown voltage. If a metal film is used as the second conducting layer and a silicon-based material (e.g., polysilicon) to which microprocessing is relatively easily performable is used as the first conducting layer, it is possible to attain both simplification of a manufacturing process of the semiconductor device and improvement of a shield characteristic with respect to mobile ions.

The other second conducting layers may not be provided at a position adjacent to one second contact portion in the second direction. Further, end parts of the second conducting layers in the first direction may partially overlap with each other in the second direction. In this case, it is preferable that the width of the second conducting layer in the second direction become narrower toward the end part thereof in the first direction.

The second conducting layers may not formed on front surfaces of all the plurality of FLR layers. The field plate portion may include a third conducting layer which is disposed along its corresponding FLR layer where no second conducting layer is formed and which is formed on a front surface of the corresponding FLR layer, when the semiconductor substrate is viewed in a plane manner. The third conducting layer includes: a front surface portion formed on the front surface of the insulating film; and a third contact portion extending from the front surface portion and penetrating through the insulating film so as to be electrically connected to the FLR layer. The third conducting layer may further include a fourth contact portion extending from the front surface portion and penetrating through the insulating film so as to be electrically connected to the first conducting layer. Note that the third contact portion may be configured to serve as the fourth contact portion so as to be electrically connected to the first conducting layer. It is preferable that the third conducting layer be provided closer to a circumference side of the semiconductor substrate than the plurality of second conducting layers. In order to attain a high breakdown voltage of the semiconductor device, it is necessary to form the FLR layers closer to a center of the semiconductor substrate so that they are disposed at a narrower interval, and the FLR layers closer to the circumference side of the semiconductor substrate can be disposed at a relatively wide interval. The third conducting layer is disposed in that area closer to the circumference side of the semiconductor substrate which does not have much effect on a breakdown voltage of the semiconductor device even if the interval between the FLR layers is widened, thereby making it possible to more surely attain a high breakdown voltage of the semiconductor device. As a material of the third conducting layer, it is possible to preferably use the materials described above as the material of the second conducting layer.

It is preferable that an end part of the second conducting layer in the first direction be provided in an area except for corners when the semiconductor substrate is viewed in a plane manner. In other words, it is preferable that the second conducting layer be formed along the FLR layer at the corners of the semiconductor substrate, and the end part of the second conducting layer be disposed in a linear part of the semiconductor substrate, so as to be disposed in an alternate manner to its adjacent second conducting layer. Since an electric field is easily concentrated on the corners of the semiconductor device, it is preferable that the second conducting layer be provided at the corners. Note that, at the corner of the semiconductor substrate viewed in a plane manner, the FLR layer is curved in a generally arc shape, and the FLR layer has a linear shape in the linear part thereof. Similarly, the first conducting layer, the second conducting layer, and the third conducting layer formed along the FLR layer are also curved in a generally arc shape at the corner of the semiconductor substrate viewed in a plane manner, and they have a linear shape in the linear part thereof.

A semiconductor element formed in the cell region of the semiconductor device according to the present application is not limited in particular, but can be, for example, an IGBT, an MOSFET, a diode, and the like. These semiconductor elements may be a vertical type or a horizontal type. Further, a protection film (e.g., a polyimide film, a silicon nitride film, or the like) may be further provided on the front surfaces of the semiconductor substrate and the field plate.

Embodiment 1

Figure 2:
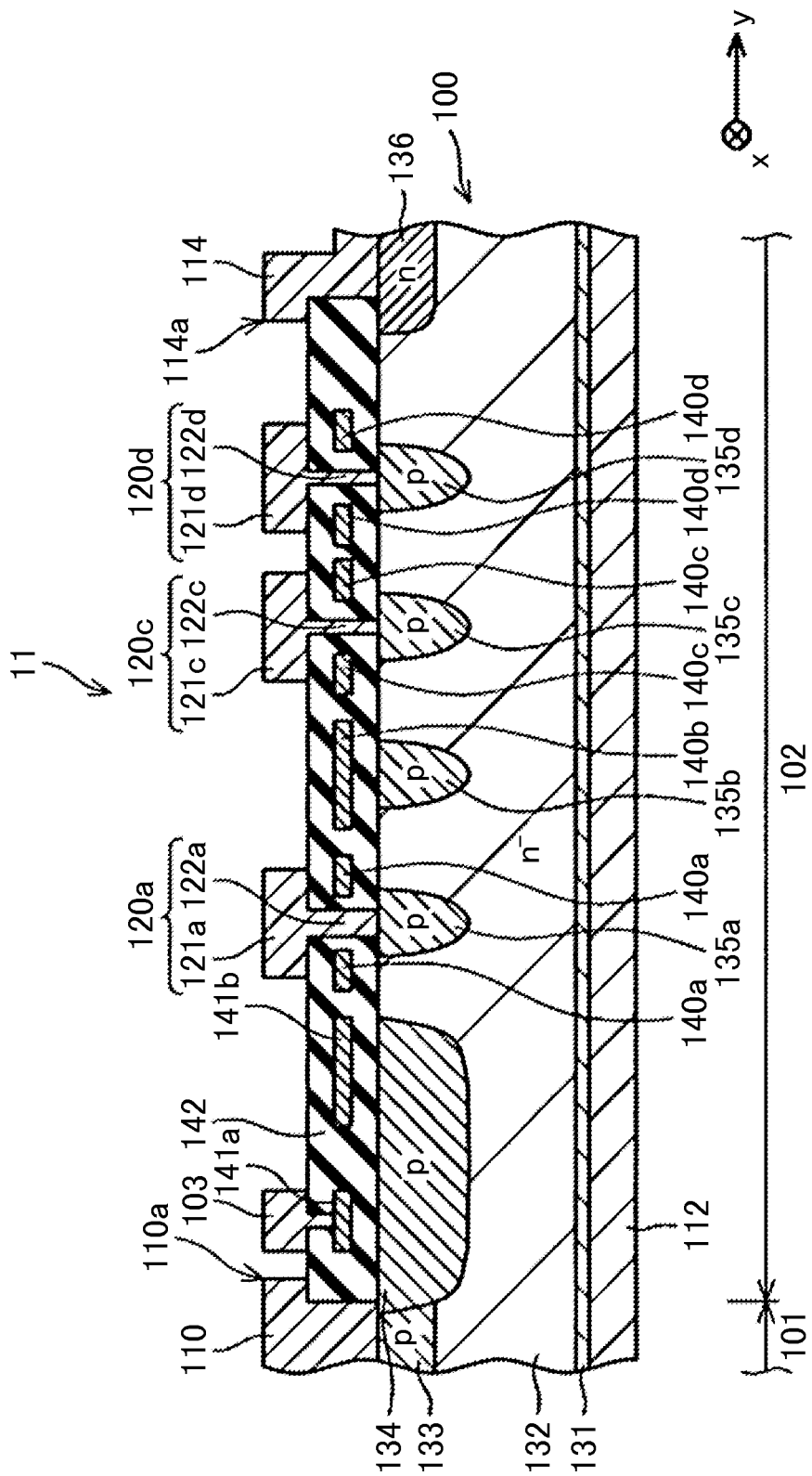
FIG. 2 is a sectional view taken along a line II-II in FIG. 1.
Figure 3:
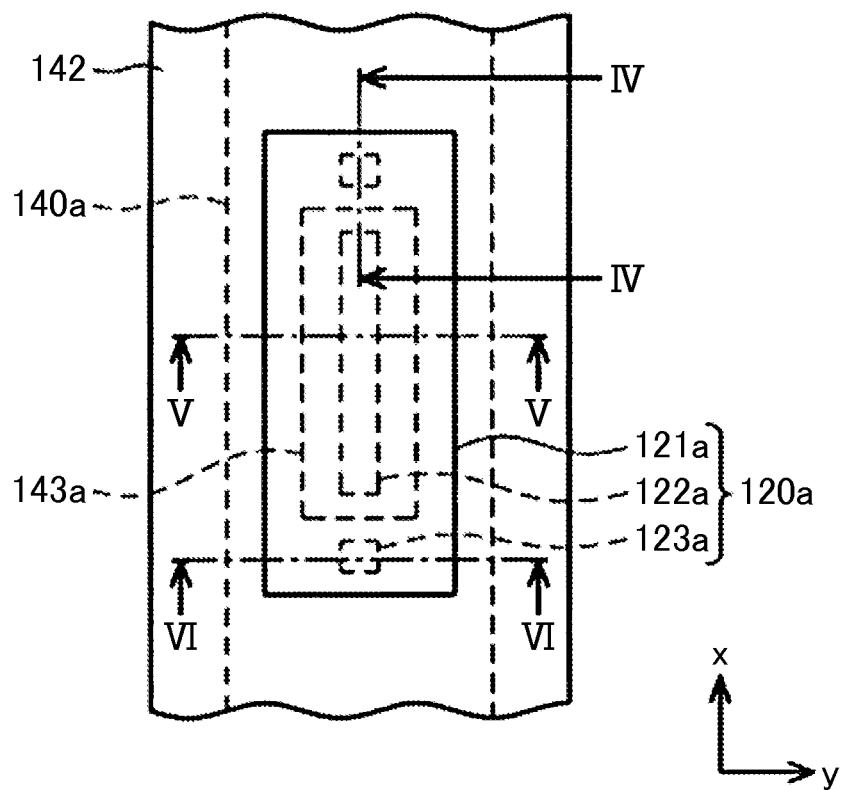
FIG. 3 is a plane view conceptually illustrating an area around a second conducting layer of Embodiment 1 in an enlarged manner.

As illustrated in FIGS. 1, 2, a semiconductor device 10 includes a semiconductor substrate 100, a field plate portion 11, a front-surface electrode 110, and a back-surface electrode 112. The semiconductor substrate 100 includes a cell region 101 and a non-cell region 102. The cell region 101 is placed in a center of the semiconductor substrate 100, and is divided into two regions. The front-surface electrode 110 is formed on a front surface of the cell region 101 of the semiconductor substrate 100. The back-surface electrode 112 is formed on back surfaces of the cell region 101 and the non-cell region 102 of the semiconductor substrate 100. The front-surface electrode 110 is an AlSi electrode, and the back-surface electrode 112 is a laminated electrode in which AlSi, Ti, Ni, and Au are laminated sequentially from a semiconductor-substrate-100 side.

Although not specifically illustrated herein, an IGBT is formed in the cell region 101. The cell region 101 includes a p-type collector layer 131, a substrate layer 132 as an n-type drift layer, a p-type body layer 133, and an emitter layer (not shown). The substrate layer 132 is an n-type semiconductor substrate including phosphorus (P) as impurity. The collector layer 131 and the substrate layer 132 extend to the non-cell region 102. A gate electric wiring 103 is formed on a front side of the non-cell region 102 of the semiconductor substrate 100, so as to surround the cell region 101. The field plate portion 11 is formed closer to the circumference side of the semiconductor substrate 100 than the gate electric wiring 103.

The non-cell region 102 includes the substrate layer 132, a p-type p layer 134 formed on the front surface of the substrate layer 132, a plurality of p-type FLR layers 135*a* to 135*d*, an n-type n layer 136, and the collector layer 131 formed on the back surface of the substrate layer 132. The plurality of FLR layers 135a to 135d is p-type semiconductor layers formed by performing ion implantation of boron (B) on the front surface of the substrate layer 132, and a concentration of the boron, which is impurity, is $1 \times 10^{14}$ cm$^{-2}$ or more. The p layer 134, the FLR layers 135a to 135d, and the n layer 136 are disposed in this order from a side closer to the cell region 101, and are each formed as a continuous generally-quadrangular layer extending in a direction along the circumference of the cell region 101 so as to surround the cell region. The p layer 134 makes contact with the body layer 133 of the cell region 101. As illustrated in FIG. 1, when the semiconductor substrate 100 is viewed in a plane manner, the FLR layers 135a to 135d surround the cell region 101, and each have a continuous generally-quadrangular shape which is linear in linear parts of the semiconductor substrate 100 and which has arc shapes at corners thereof. Although not illustrated in FIG. 1, similarly to the FLR layers 135a to 135d, the p layer 134 and the n layer 136 also surround the cell region 101, and each have a generally-quadrangular shape which is linear in the linear parts of the semiconductor substrate 100 and which has arc shapes at the corners thereof. When a longitudinal direction of the FLR layers 135a to 135d (a circumferential direction of the generally quadrangular FLR layers 135a to 135d illustrated in FIG. 1, and an x-axis direction illustrated in FIG. 2) is a first direction, and a direction perpendicular to the first direction (a direction of a normal vector of the continuous generally-quadrangular FLR layers 135a to 135d illustrated in FIG. 1, and a positive direction or a negative direction of a y-axis illustrated in FIG. 2) is a second direction, the p layer 134, the FLR layers 135a to 135d, and the n layer 136 are disposed at intervals in the second direction.

The field plate portion 11 includes: an insulating film 142 made from a silicon oxide; a plurality of first conducting layers 140a to 140d made from polysilicon; and second conducting layers 120a, 120b and third conducting layers 120c, 120d made from aluminum. The insulating film 142 is formed on a front surface of the non-cell region 102.

The first conducting layers 140a to 140d are formed inside the insulating film 142. The first conducting layers 140a to 140d are disposed at intervals in the second direction and insulated from each other via the insulating film 142 provided therebetween. The first conducting layers 140a to 140d are disposed along their corresponding FLR layers 135a to 135d, and each have a continuous generally-quadrangular shape, similarly to the FLR layers 135a to 135d. The first conducting layers 140a to 140d have a thickness of 1 μm or less. Note that, the insulating film 142 is also formed on a front surface of the p layer 134, and conducting layers 141a, 141b made from polysilicon are formed thereinside. The conducting layers 141a, 141b are disposed on a front side of the p layer 134 along the p layer 134, and are each formed in a continuous generally-quadrangular shape. The conducting layer 141a, the conducting layer 141b, and the first conducting layer 140a are disposed at intervals in the second direction, and insulated from each other via the first insulating film 142 provided therebetween. The gate electric wiring 103 is placed at a front side of the p layer 134, and extends from the front surface of the insulating film 142 so as to penetrate through the insulating film 142 and reach the conducting layer 141a. A conducting layer 104 is placed at the front side of the p layer 134, and intermittently disposed along a circumferential direction of the p layer 134. At a back side of the conducting layer 104, a hole portion (not illustrated) is provided in the conducting layer 141b. The conducting layer 104 includes a contact portion (not shown) penetrating through the insulating film 142 from the front surface of the insulating film 142 and extending to reach the p layer 134 via the hole portion of the conducting layer 141b, and hereby, the conducting layer 104 is electrically connected to the p layer 134. Further, the conducting layer 104 includes a contact portion (not shown) penetrating through the insulating film 142 from the front surface of the insulating film 142 so as to reach the conducting layer 141b, and hereby, the conducting layer 104 is electrically connected to the conducting layer 141b. Note that the conducting layer 104 may be formed intermittently as illustrated in FIG. 1 or may be formed in a continuous generally-quadrangular shape. Further, on the circumference side of the semiconductor substrate 100 outside the field plate portion 11 (in the positive direction of the y-axis in FIG. 2), an electrode 114 electrically connected to the n layer 136 is formed. Note that the insulating film 142, the first conducting layers 140a to 140d, the n layer 136, and the electrode 114 are not illustrated in FIG. 1.

As illustrated in FIGS. 3 to 6, a hole portion 143a is formed in the first conducting layer 140a formed along the FLR layer 135a, and a second conducting layer 120a is formed on a front side of the hole portion 143a. In a plane view, an area of the second conducting layer 120a is larger than that of the hole portion 143a. A width of the second conducting layer 120a in the second direction (a y-axis direction illustrated in FIG. 3) is preferably smaller than a width of the first conducting layer 140a in the second direction, but may be larger than that.

Figure 4:
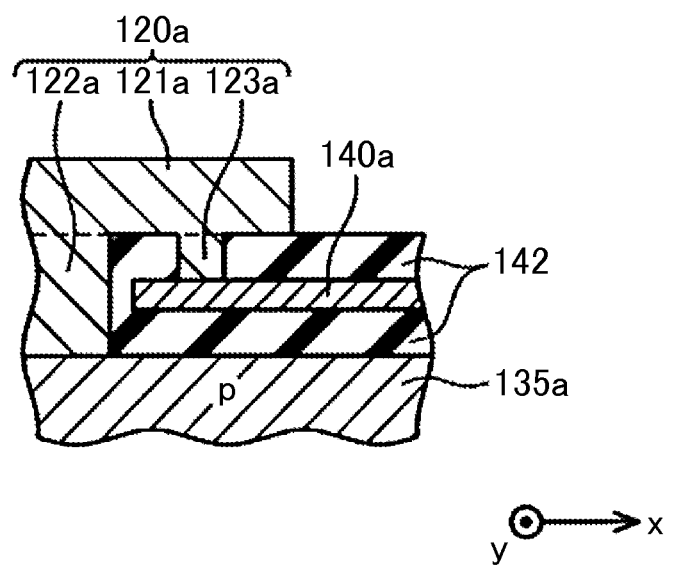
FIG. 4 is a sectional view taken along a line IV-IV in FIG. 3.
Figure 5:
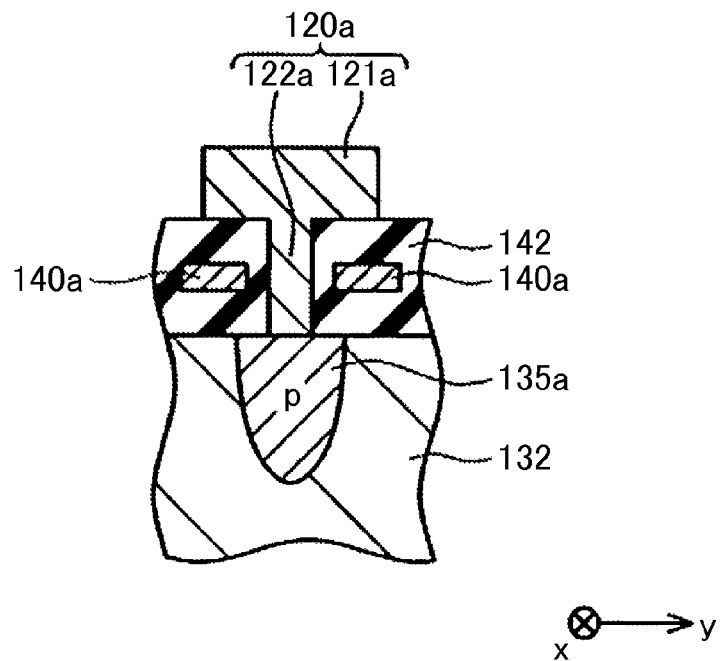
FIG. 5 is a sectional view taken along a line V-V in FIG. 3.
Figure 6:
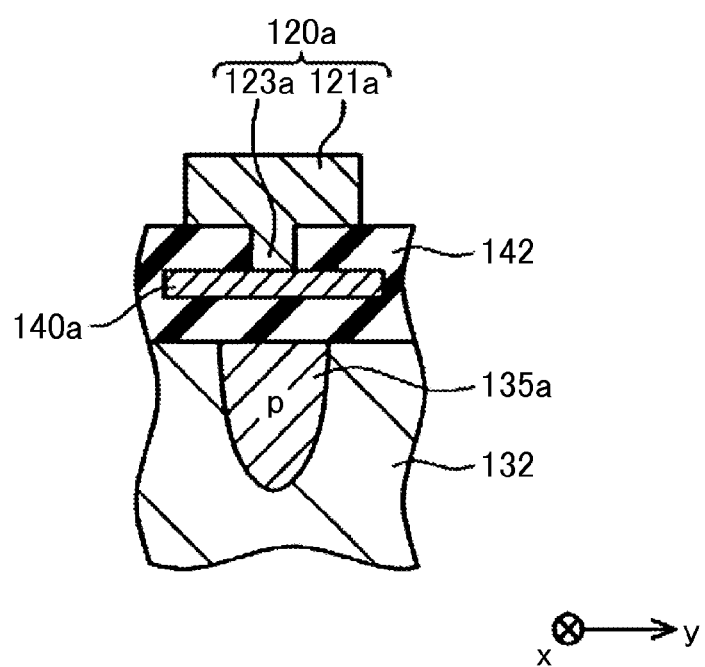
FIG. 6 is a sectional view taken along a line VI-VI in FIG. 3.

The second conducting layer 120a includes a front surface portion 121a, a first contact portion 123a, and a second contact portion 122a. The front surface portion 121a is formed on the front surface of the insulating film 142. The first contact portion 123a extends from the front surface portion 121a so as to penetrate through the insulating film 142 and to reach the conducting layer 140a, and hereby, the first contact portion 123a is electrically connected to the conducting layer 140a. The second contact portion 122a extends from the front surface portion 121a so as to penetrate through the insulating film 142, and is electrically connected to the FLR layer 135a. As illustrated in FIGS. 4, 5, the second contact portion 122a is isolated from the first conducting layer 140a via the insulating film 142, and the first contact portion 123a is isolated from the second contact portion 122a via the insulating film 142. The front surface portion 121a, the first contact portion 123a, and the second contact portion 122a are integrally formed from the same material, and the first contact portion 123a is electrically connected to the second contact portion 122a via the front surface portion 121a. Although not illustrated herein, the first conducting layer 140b, the second conducting layer 120b, and the FLR layer 135b are also connected to each other, similarly to the first conducting layer 140a, the second conducting layer 120a, and the FLR layer 135a.

The second conducting layer 120b is not formed at a position adjacent to the second conducting layer 120a in the second direction (in the positive direction of the y axis illustrated in FIG. 2 and the like, in this case). In other words, the second conducting layer 120a is not formed at a position adjacent to the second conducting layer 120b in the second direction (in the negative direction of the y axis illustrated in FIG. 2 and the like, in this case). Accordingly, the first contact portion 123b and the second contact portion 122b of the second conducting layer 120b are not provided at respective positions adjacent to the first contact portion 123a and the second contact portion 122a of the second conducting layer 120a in the second direction. Further, the first contact portion 123a and the second contact portion 122a of the second conducting layer 120a are not provided at respective positions adjacent to the first contact portion 123b and the second contact portion 122b of the second conducting layer 120b in the second direction. Note that the conducting layer 104 and its contact portions, and the second conducting layer 120a and its contact portions (the first contact portion 123a and the second contact portion 122a) have a similar positional relationship to that of the second conducting layers 120a, 120b and their contact portions. That is, the second conducting layer 120a is not formed at a position adjacent to the conducting layer 104 in the second direction. Further, the first contact portion 123a and the second contact portion 122a are not provided at respective positions adjacent to the contact portions of the conducting layer 104 in the second direction.

As illustrated in FIGS. 1, 2, when the semiconductor substrate 100 is viewed in a plane manner, the third conducting layers 120c, 120d are disposed along the FLR layers 135c, 135d, respectively, and are each formed in a continuous generally-quadrangular shape, similarly to the FLR layers 135a to 135d. The second conducting layers 120a, 120b and the third conducting layers 120c, 120d are disposed at intervals in a y-direction. The first conducting layers 140c, 140d are provided with hole portions, similarly to the first conducting layer 140a, 140b. The third conducting layers 120c, 120d respectively include: front surface portions 121c, 121d; and third contact portions 122c, 122d penetrating through the insulating film 142 so as to reach the FLR layers 135c, 135d, respectively, and extending via the hole portion of the first conducting layer 140c and via the hole portion of the first conducting layer 140d, respectively. The third conducting layers 120c, 120d are electrically connected to the FLR layers 135c, 135d via the third contact portions 122c, 122d, respectively. Further, the third conducting layers 120c, 120d include fourth contact portions (not shown) extending from the front surface portions 121c, 121d, respectively, and penetrating through the insulating films 142 so as to reach the first conducting layers 140c, 140d, respectively. Hereby, the third conducting layers 120c, 120d are electrically connected to the first conducting layers 140c, 140d, respectively, via the fourth contact portions.

The first conducting layers 140a to 140d and the conducting layers 141a, 141b are made from polysilicon, which is the same as a gate electrode (not shown) of an insulated gate of the IGBT formed in the cell region 101, and contain $1 \times 10^{13}$ $cm^{-2}$ or more of impurity ions. The first conducting layers 140a to 140d are formed at the same time in a step of forming the gate electrode of the IGBT in the manufacturing process of the semiconductor device 10. The second conducting layers 120a, 120b, the third conducting layers 120c, 120d, and the electrode 114 are made from aluminum, which is the same as the front-surface electrode 110, and are formed at the same time in a step of forming the front-surface electrode 110 in the manufacturing process of the semiconductor device 10.

As described above, in the semiconductor device 10, the second conducting layers 120a, 120b are disposed along their corresponding FLR layers 135a, 135b so as to be provided partially on their front surfaces in an intermittent manner. Further, the first contact portion 123b and the second contact portion 122b of the second conducting layer 120b are not provided at respective positions adjacent to the first contact portion 123a and the second contact portion 122a of the second conducting layer 120a in the second direction. Further, the first contact portion 123a and the second contact portion 122a of the second conducting layer 120a are not provided at respective positions adjacent to the first contact portion 123b and the second contact portion 122b of the second conducting layer 120b in the second direction. Thus, the first contact portions 123a, 123b and the second contact portions 122a, 122b of the second conducting layers 120a, 120b adjacent to each other in the second direction do not overlap with each other in the second direction. Accordingly, even if the FLR layers 135a, 135b are provided at a narrow interval, it is possible to secure widths of the second conducting layers 120a, 120b in the second direction. In a case where a thick metal film or the like that is relatively difficult to be made fine is used for the second conducting layers 120a, 120b, it is possible to narrow the interval between the FLR layers 135a, 135b, thereby making it possible to attain a high breakdown voltage of the semiconductor device 10. That is, it is possible to form the second conducting layers 120a, 120b by use of a material contained in the front-surface electrode 110, and it is also possible to narrow the interval between the FLR layers 135a, 135b. This makes it possible to manufacture a semiconductor device having a high breakdown voltage with a simple manufacturing process. Note that, in Embodiment 1, the conducting layer 104 and its contact portions, and the second conducting layer 120a and its contact portions also have a similar positional relationship to that between the second conducting layers 120a, 120b. Similarly, even if an interval between the p layer 134 and the FLR layer 135a is narrowed, it is possible to secure widths of the conducting layer 104 and the second conducting layer 120a in the second direction, thereby making it possible to obtain the same effect as above.

(Modified Embodiment)

Figure 9:
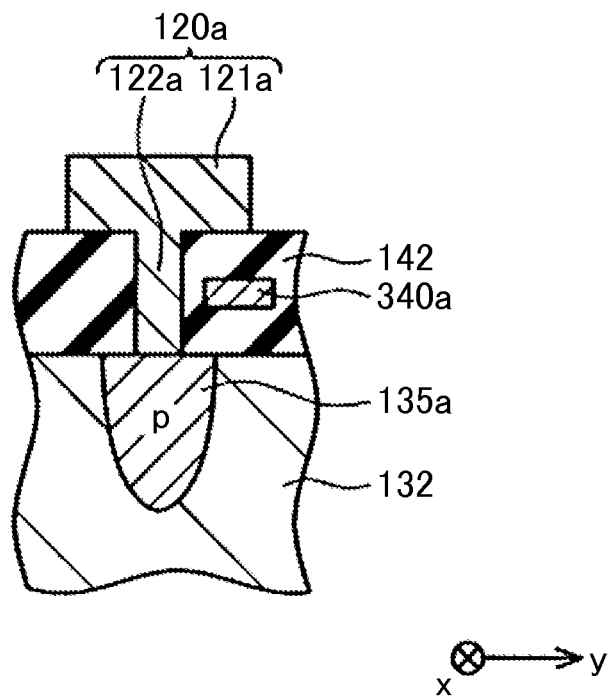
FIG. 9 is a sectional view taken along a line IX-IX in FIG. 8.

Configurations of the first conducting layer, the second conducting layer, and the like are not limited to the configurations described in Embodiment 1. For example, as illustrated in FIG. 7, a second conducting layer 220a including a front surface portion 221a, a first contact portion 223a, and a second contact portion 222a may be employed. In the second conducting layer 220a, an insulating film 242 is not provided between the first contact portion 223a and the second contact portion 222a, and the first contact portion 223a and the second contact portion 222a make contact with each other. Further, as illustrated in FIGS. 8, 9, a first conducting layer 340a may include a rectangular notch 343a below a second conducting layer 120a, and a second contact portion 122a of the second conducting layer 120a may be placed in the notch 343a.

Figure 10:
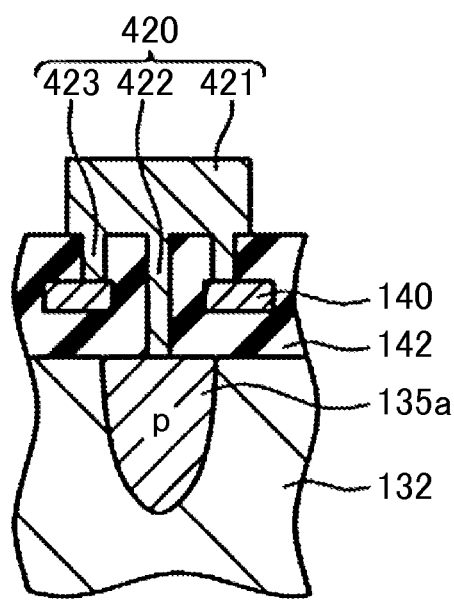
FIG. 10 is a sectional view of an area around a second conducting layer of a semiconductor device according to a modified embodiment.
Figure 11:
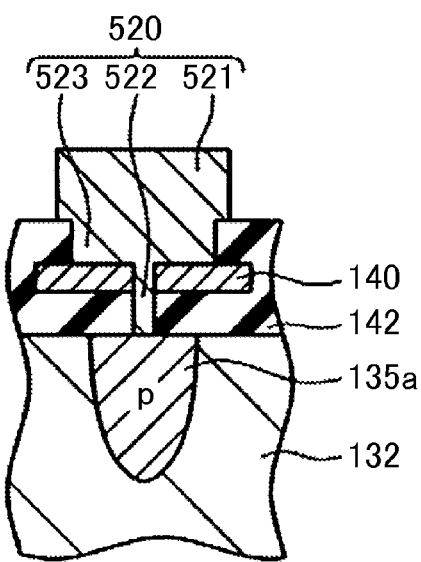
FIG. 11 is a sectional view of an area around a second conducting layer of a semiconductor device according to a modified embodiment.

Further, as illustrated in FIG. 10, a second conducting layer 420 having a front surface portion 421, a first contact portion 423, and a second contact portion 422 may be employed. In the second conducting layer 420, the first contact portion 423 and the second contact portion 422 are disposed in the second direction, and the first contact portion 423 is isolated from the second contact portion 422 via an insulating film 142. Further, as illustrated in FIG. 11, a second conducting layer 520 having a front surface portion 521, a first contact portion 523, and a second contact portion 522 may be employed. In the second conducting layer 520, the first contact portion 523 and the second contact portion 522 are disposed in the second direction, and make contact with each other in the second direction. Further, in a plurality of second conducting layers, respective front surface portions, respective first contact portions, and respective second contact portion may be configured differently from each other.

Figure 12:
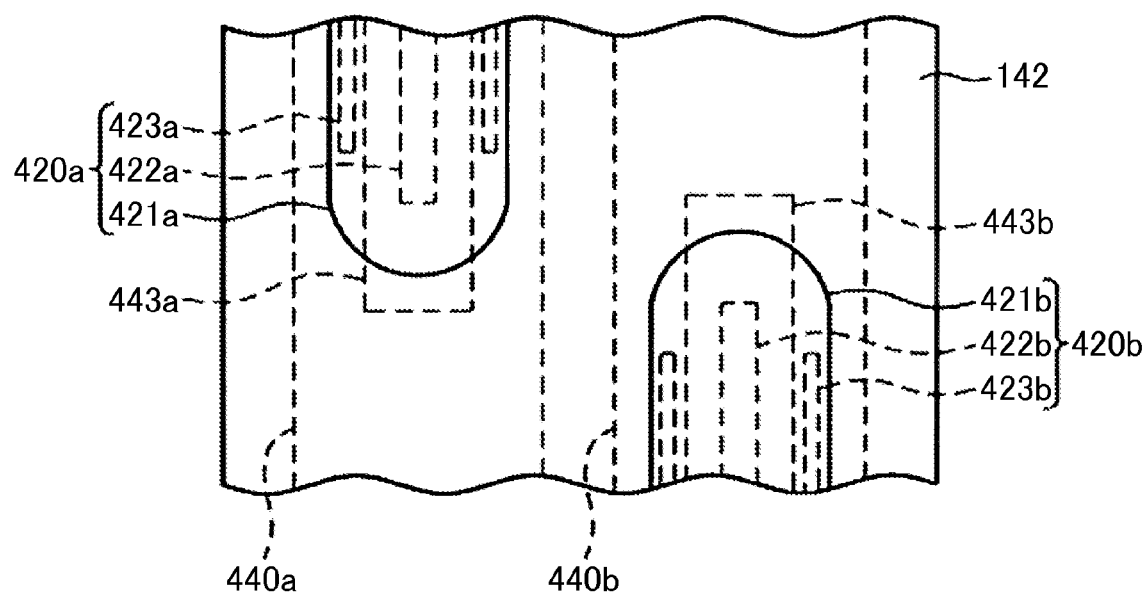
FIG. 12 is a plan view of an area around a second conducting layer of a semiconductor device according to a modified embodiment.

Further, if respective first contact portions and respective second contact portions of a plurality of second conducting layers adjacent to each other in the second direction do not overlap with each other in the second direction, another second conducting layer may be formed at a position adjacent to one second contact portion in the second direction, as illustrated in FIGS. 12, 13. For example, second conducting layers 420a, 420b as illustrated in FIG. 12 may be employed. An end part of a front surface portion 421a of the second conducting layer 420a in an x-direction and an end part of a front surface portion 421b of the second conducting layer 420b in the x-direction overlap with each other in the second direction. That is, part of the second conducting layer 420b is placed at a position adjacent to the second conducting layer 420a in the second direction. The end parts of the front surface portions 421a, 421b in the first direction have a semicircular shape, and widths thereof in the second direction becomes narrow toward their end sides. Similarly to FIG. 10, a first contact portion 423a and a second contact portion 422a, and a first contact portion 423b and a second contact portion 422b are disposed in the second direction, and they are formed in regions where the second conducting layer 420a and the second conducting layer 420b do not overlap with each other. Accordingly, the first contact portion 423b is not formed at a position adjacent to the first contact portion 423a in the second direction, and the second contact portion 422b is not formed at a position adjacent to the second contact portion 422a in the second direction.

Similarly, second conducting layers 420f, 420g as illustrated in FIG. 13 may be employed. An end part of a front surface portion 421f of the second conducting layer 420f in the x-direction and an end part of a front surface portion 421g of the second conducting layer 420g in the x-direction overlap with each other in the second direction, and part of the second conducting layer 420g is placed at a position adjacent to the second conducting layer 420f in the second direction. End parts of the front surface portions 421f, 421g in the first direction thereof are configured such that their widths in the second direction are narrower than those of central parts thereof. Similarly to FIG. 10, a first contact portion 423f and a second contact portion 422f, and a first contact portion 423g and a second contact portion 422g are disposed in the second direction, and they are formed in regions where the second conducting layer 420f and the second conducting layer 420g do not overlap with each other. Accordingly, the first contact portion 423g is not formed at a position adjacent to the first contact portion 423f in the second direction, and the second contact portion 422g is not formed at a position adjacent to the second contact portion 422f in the second direction.

Figure 14:
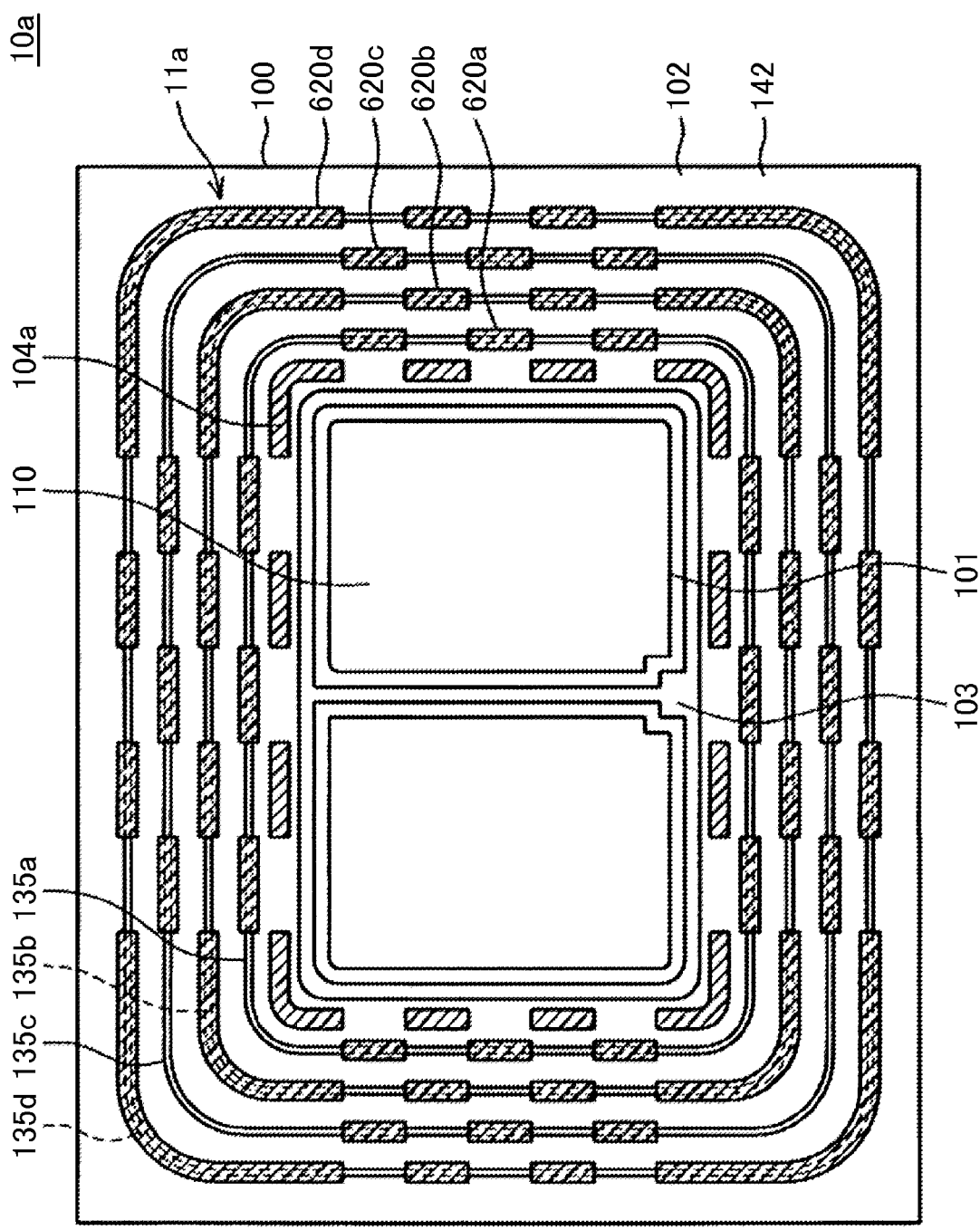
FIG. 14 is a plan view of a semiconductor device according to a modified embodiment.
Figure 15:
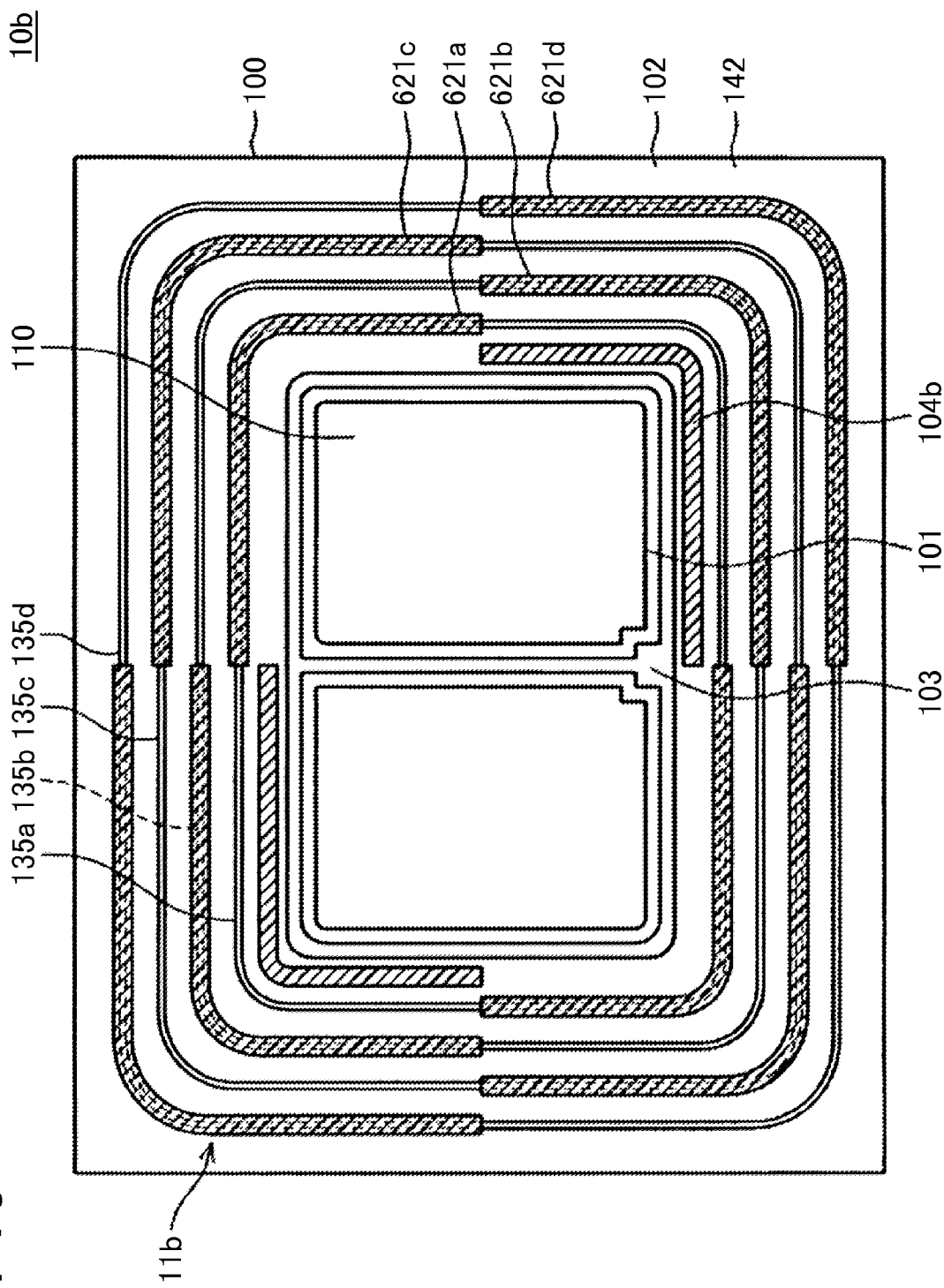
FIG. 15 is a plan view of a semiconductor device according to a modified embodiment.

Further, an arrangement of the second conducting layers is not limited to those illustrated in FIG. 1 and so on. For example, as illustrated in FIGS. 14, 15, a semiconductor device 10a including a floating portion 11a that does not include a third conducting layer but includes second conducting layers 620a to 620d may be employed, or a semiconductor device 10b including a floating portion 11b that does not include a third conducting layer but includes second conducting layers 621a to 621d may be employed. Further, like the second conducting layers 620b, 620d, 621b, 621d, at least part thereof may be disposed at corners of the semiconductor substrate 100 in a plane view. Similarly, instead of the conducting layer 104 illustrated in FIG. 1, conducting layers 104a, 104b each configured such that at least part thereof is disposed at the corners of the semiconductor substrate 100 in a plane view may be employed. Further, a length of the second conducting layer in the second direction is not limited in particular. For example, as illustrated in FIG. 15, the second conducting layers 621a to 621d each having a length about at least a quarter of a circumference of an FLR layer may be employed. Note that, instead of the conducting layer 104 illustrated in FIG. 1, a conducting layer 104b having a length about at least a quarter of a circumference of a p layer 134 may be used. According to such a configuration, the number of end parts of the second conducting layers in the first direction is decreased, thereby making it possible to reduce a probability that mobile ions avoid the second conducting layers and linearly move in the second direction. Note that a length of the second conducting layer in the first direction is preferably not less than a distance D1 between an end part (an end part 110a illustrated in FIG. 2) of the front-surface electrode on its circumference side and an electrode (an end part 114a illustrated in FIG. 2) on the front surface of the n layer provided on a circumference side of the semiconductor substrate outside the floating layer, and more preferably not less than a distance D2 between the end part of the front-surface electrode on the circumference side and that closest end part of that semiconductor substrate which is placed at a side where the floating layer is formed. As the length of the second conducting layer in the first direction becomes longer, mobile ions should move longer distance to reach an adjacent second conducting layer. If the length of the second conducting layer in the first direction is the distance D1 or more, it is possible to reduce, to 50 % or less, the probability that mobile ion moves from one second conducting layer to its adjacent second conducting layer. As illustrated in the semiconductor devices 10a, 10b, it is preferable to dispose the second conducting layer so that the end part of the second conducting layer in the first direction is not placed at a corner of the semiconductor substrate 100.

Figure 16:
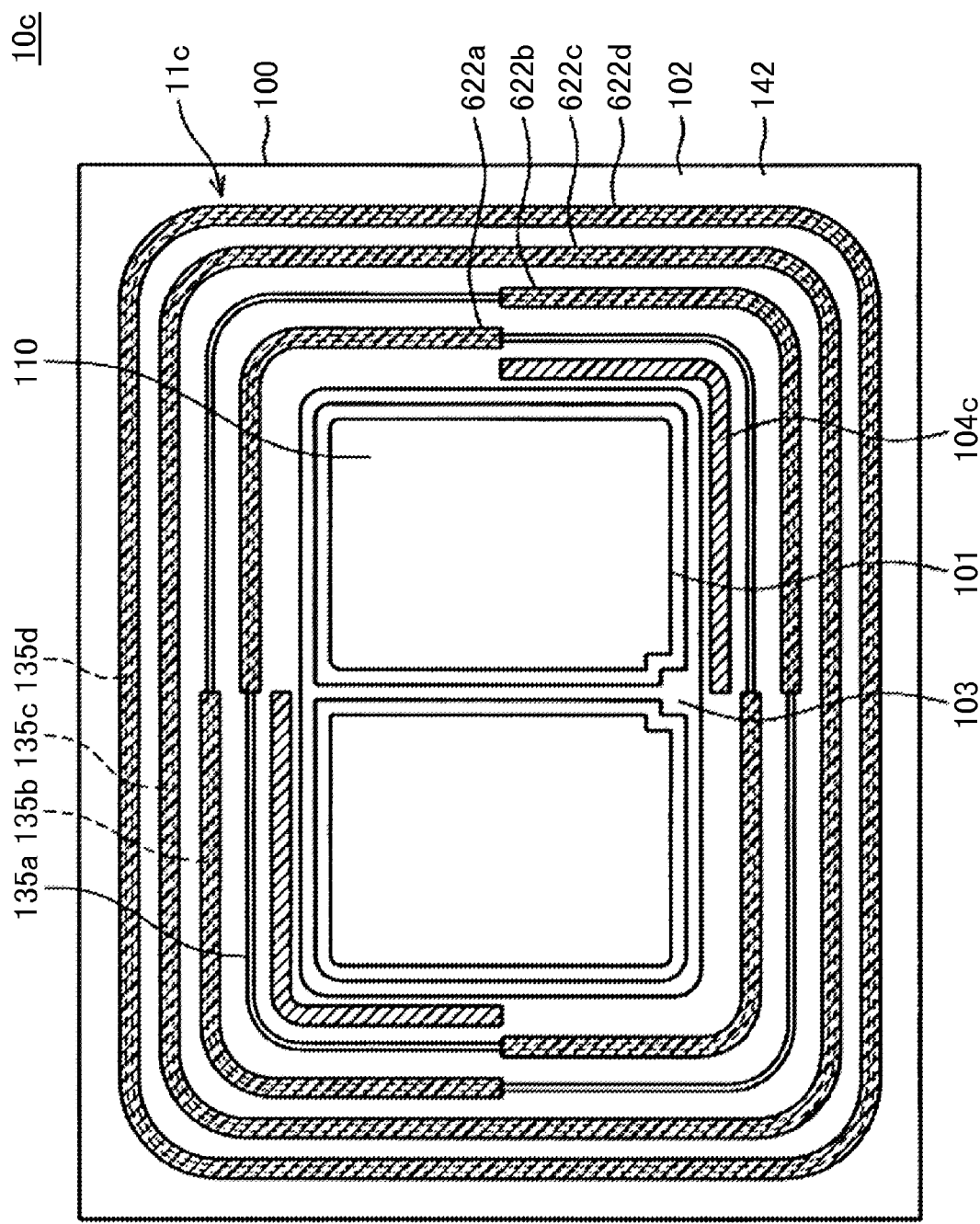
FIG. 16 is a plan view of a semiconductor device according to a modified embodiment.
Figure 17:
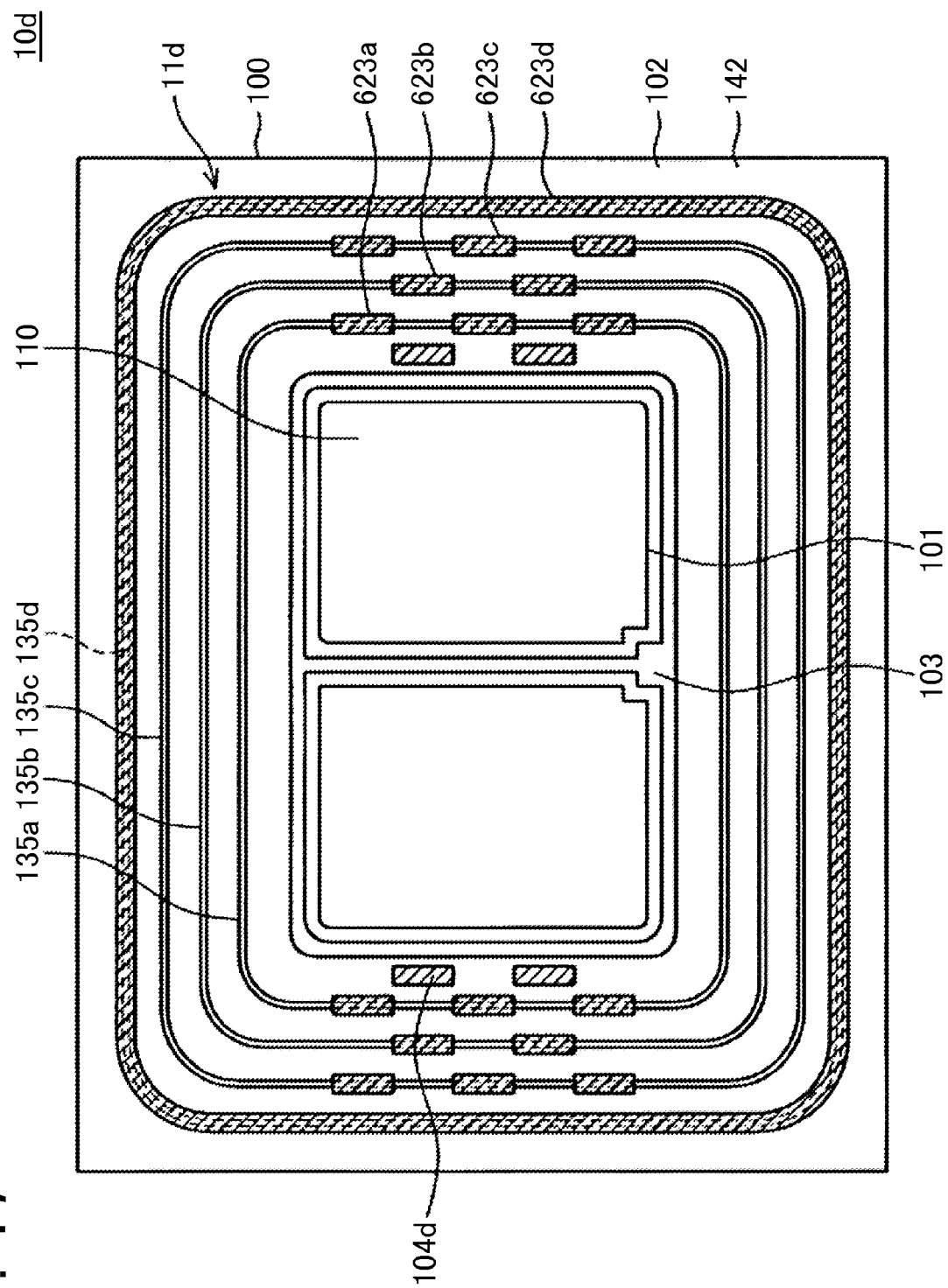
FIG. 17 is a plan view of a semiconductor device according to a modified embodiment.

Further, as illustrated in FIG. 16, a semiconductor device 10c including a floating portion 11c including second conducting layers 622a, 622b each having a length about at least a quarter of a circumference of an FLR layer, and third conducting layers 622c, 622d may be employed. The third conducting layers 622c, 622d are similar to the third conducting layers 120c, 120d illustrated in FIG. 1, respectively, and the second conducting layers 622a, 622b and a conducting layer 104c are similar to the second conducting layers 621a, 621b and the conducting layer 104b illustrated in FIG. 15, respectively, so that descriptions thereof are omitted. Further, as illustrated in FIG. 17, a semiconductor device 10d including a floating portion 11d configured such that a third conducting layer 623d is formed only on an upper part of an FLR layer provided closest to a circumference side of a semiconductor substrate 100, and second conducting layers 623a to 623c are formed on a central side thereof may be employed. Further, like the second conducting layers 623a to 623c, intervals between the second conducting layers may not be uniform, and regions where no second conducting layers 623a to 623c are provided may be provided on front sides of a plurality of FLR layers 135a to 135d adjacent to each other in the second direction. Similarly, instead of the conducting layer 104 illustrated in FIG. 1, conducting layers 104d disposed at uneven intervals may be used. Further, in a case where the third conducting layer is provided like the semiconductor devices 10, 10c, 10d, it is preferable that the third conducting layer be provided closer to the circumference side of the semiconductor substrate 100 than the second conducting layers.

Figure 18:
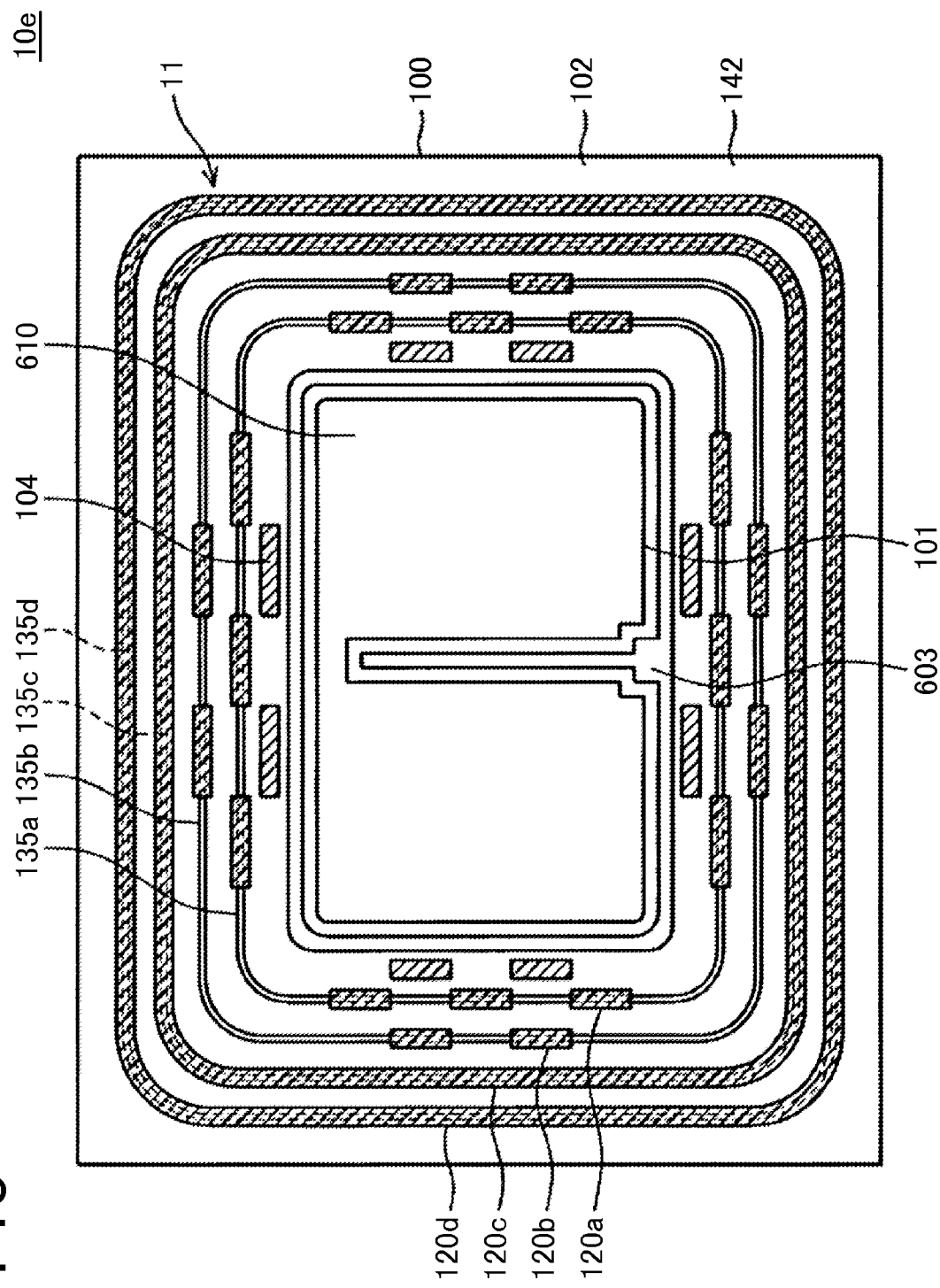
FIG. 18 is a plan view of a semiconductor device according to a modified embodiment.
Figure 19:
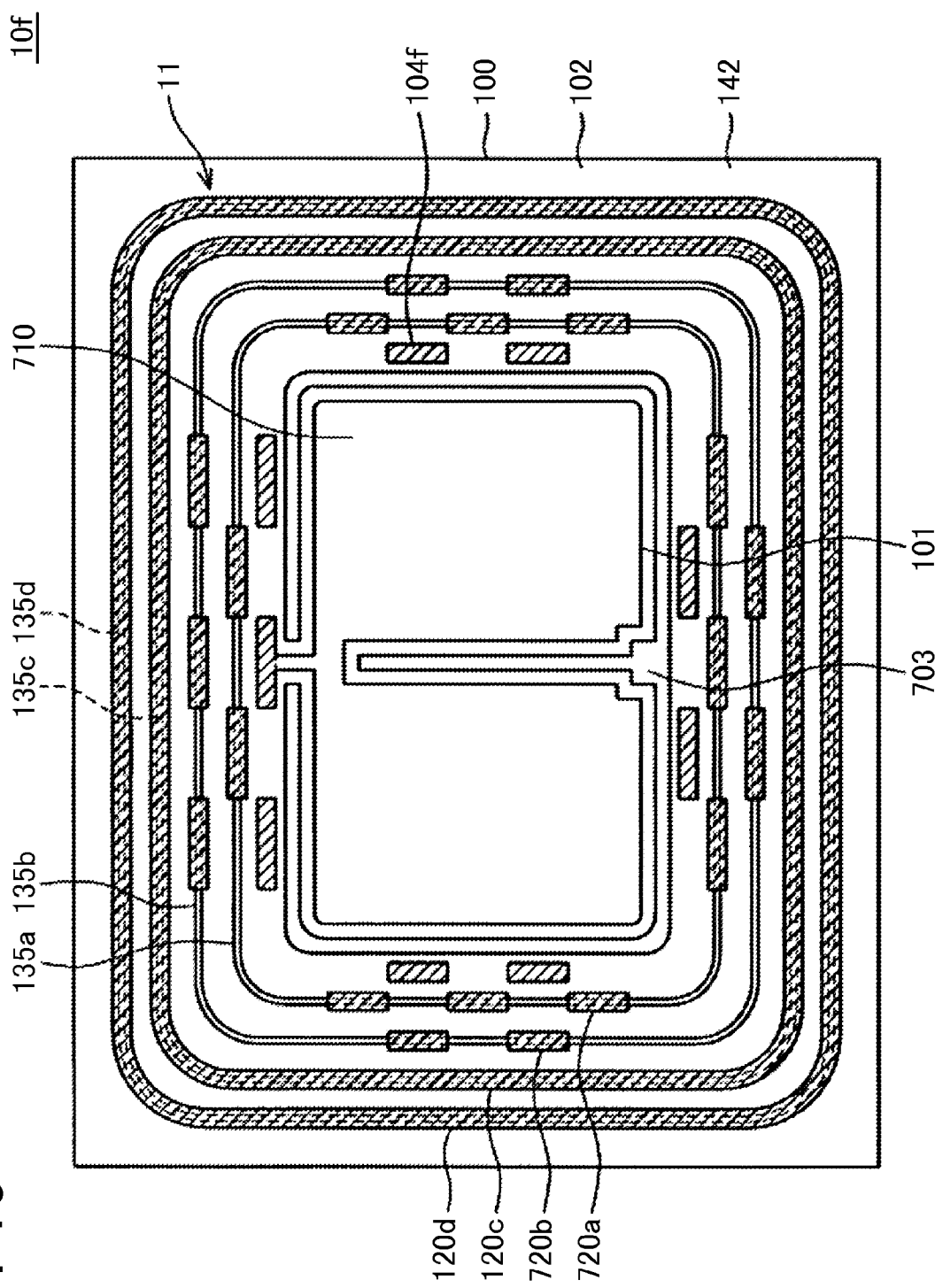
FIG. 19 is a plan view of a semiconductor device according to a modified embodiment.

Further, configurations of the front surface electrode and the gate electric wiring are not limited to the configurations described in Embodiment 1. For example, as illustrated in FIG. 18, a semiconductor device 10e including one front-surface electrode 610 formed in a partially connected manner on a front surface of a semiconductor substrate 100, and a gate electric wiring 603 surrounding the front-surface electrode 610 may be employed. Further, like a semiconductor device 10f illustrated in FIG. 19, a conducting layer 104f may be provided instead of the conducting layer 104 illustrated in FIG. 1, and a front-surface electrode 710 may extend so as to make contact with the conducting layer 104f, so that the front-surface electrode 710 is electrically connected to the conducting layer 104f. Note that the conducting layer 104f is obtained by partially changing an arrangement of the conducting layer 104 in vicinity to a connecting portion with respect to the front-surface electrode 710 so that the conducting layer 104f is easily connected to the front-surface electrode 710 via an electric wiring. Further, second conducting layers 720a, 720b are obtained by partially changing an arrangement of the second conducting layers 120a, 120b in vicinity to the connecting portion between the front-surface electrode 710 and the conducting layer 104f, according to an arrangement of the conducting layer 104f. A gate electric wiring 703 is formed so as to surround the front-surface electrode 710. Note that, in the descriptions of FIGS. 7 to 19, a description about a configuration similar to the semiconductor device 10 illustrated in Embodiment 1 is omitted. Although not illustrated herein, in accordance with changes of positions of the conducting layer 104a and the like and the second conducting layers 620a and the like, a position of a contact portion therebetween and a position of a hole portion of the first conducting layer and the like on its back side are also changed.

The embodiment of the present invention has been described in detail, but the embodiment is only an example and does not limit the scope of Claims. A technique according to Claims includes embodiments obtained by variously modifying or altering the concrete embodiments exemplified as above.

Technical elements described in the present specification or the drawings exhibit a technical usability solely or in various combinations, and are not limited to combinations as described in Claims as of filing the present application. Further, the technique exemplified in the present specification or the drawings can achieve a plurality of objects at the same time, and has a technical usability by achieving one of those objects.

The invention claimed is:

1. A semiconductor device comprising:
   a semiconductor substrate having a cell region where a semiconductor element is formed, and a non-cell region provided around the cell region; and
   a field plate portion formed on a front surface of the non-cell region, wherein:
   the non-cell region includes:
      a substrate layer having a first-conductivity-type; and
      a plurality of field limiting ring layers formed on a front surface of the substrate layer, extending in a first direction along a circumference of the cell region so as to surround the cell region, disposed at intervals in a second direction perpendicular to the first direction, and each having a second-conductivity-type,
   the field plate portion includes:
      an insulating film formed on a front surface of the semiconductor substrate;
      a plurality of first conducting layers each formed in the insulating film for a corresponding field limiting ring layer so as to be disposed along the corresponding field limiting ring layer when the semiconductor substrate is viewed in a plane manner; and
      a plurality of second conducting layers formed so as to respectively correspond to at least two field limiting ring layers adjacent to each other, the second conducting layers respectively disposed on part of corresponding field limiting ring layers in an intermittent manner along the corresponding field limiting ring layers when the semiconductor substrate is viewed in a plane manner and each including a front surface portion, a first contact portion and a second contact portion, the front surface portion formed on a front surface of the insulating film, the first contact portion extending from the front surface portion and penetrating through the insulating film so as to be electrically connected to the first conducting layer, and the second contact portion extending from the front surface portion and penetrating through the insulating film so as to be electrically connected to the field limiting ring layer,
   any of the first contact portions of the second conducting layers are not provided at a position adjacent to the first contact portion in the second direction, and
   any of the second contact portions of the second conducting layers are not provided at a position adjacent to the second contact portion in the second direction.

2. The semiconductor device according to claim 1, wherein:
   the field plate portion further includes a third conducting layer disposed along a corresponding field limiting ring layer where no second conducting layer is formed when the semiconductor substrate is viewed in a plane manner, the third conducting layer including a front surface portion and a third contact portion, the front surface portion formed on the front surface of the insulating film, and the third contact portion extending from the front surface portion and penetrating through the insulating film so as to be electrically connected to the corresponding field limiting ring layer, and
   the third conducting layer is provided closer to a circumference side of the semiconductor substrate than the plurality of second conducting layers when the semiconductor substrate is viewed in a plane manner.

3. The semiconductor device according to claim 1, wherein:
   an end part of the second conducting layer in the first direction is provided in an area except for corners of the semiconductor substrate viewed in a plane manner.

* * * * *